(12) United States Patent
Wang

(10) Patent No.: US 6,583,670 B2
(45) Date of Patent: Jun. 24, 2003

(54) CMOS CURRENT AMPLIFIER

(75) Inventor: Chunyan Wang, Montreal (CA)

(73) Assignee: Valorbec, Limited Partnership, Montreal (CA)

( * ) Notice: Subject to any disclaimer, the term of this patent is extended or adjusted under 35 U.S.C. 154(b) by 73 days.

(21) Appl. No.: 09/794,222

(22) Filed: Feb. 28, 2001

(65) Prior Publication Data

US 2001/0028274 A1 Oct. 11, 2001

Related U.S. Application Data

(60) Provisional application No. 60/185,499, filed on Feb. 28, 2000.

(51) Int. Cl.[7] ................................................. H03F 3/16
(52) U.S. Cl. ........................................ 330/277; 330/311
(58) Field of Search ............................... 330/277, 296, 330/310, 311

(56) References Cited

U.S. PATENT DOCUMENTS

| | | | | |
|---|---|---|---|---|
| 5,198,782 A | * | 3/1993 | Scott | 330/277 |
| 5,389,892 A | * | 2/1995 | Embree | 330/253 |
| 5,469,104 A | * | 11/1995 | Smith et al. | 330/311 X |
| 5,834,951 A | | 11/1998 | Klein | |
| 5,867,066 A | | 2/1999 | Dell'Ova et al. | |
| 6,246,288 B1 | * | 6/2001 | Yamamoto | 330/253 |
| 6,396,352 B1 | * | 5/2002 | Muza | 330/311 |

OTHER PUBLICATIONS

T. Kaulberg. "A CMOS current–mode operational amplifier", *IEEE, J. Solid State Circuits*, vol. 28, No. 7, Feb. 1993, pp. 849–852.

E.Abou–Allam et al. "A 200 MHz steered current operational amplifier in 1.2 CMOS technology", *IEEE J. Solid State Circuits*, vol. 32, No. 2, Feb. 1997, pp–245–249.

G. Palmisano et al. "High–drive CMOS current amplifier", *IEEE J. Solid State Circuits*, vol. 33, No. 2, Feb. 1998, pp 228–236.

E. Bruun, "Constant–bandwidth current mode operational amplifier" *Electronics Letters*, vol.28, No. 18, Aug. 1991, pp 1673–1674.

* cited by examiner

*Primary Examiner*—Steven J. Mottola
(74) *Attorney, Agent, or Firm*—James Anglehart; Ogilvy Renault

(57) ABSTRACT

This invention relates to a method and apparatus for amplifying an input current into an output current. An input current is first injected in or pulled out of a transimpedance stage and converted, in a linear way, into an interstage voltage. The interstage voltage is then converted into the output current. The conversion of the interstage voltage into an output current is performed by maintaining a transistor in the triode mode to obtain a linear conversion as well as adding a current which comes from a current source.

13 Claims, 4 Drawing Sheets

| | T1 | T2 |
|---|---|---|
| ZONE 1 | TRIODE | OFF |
| ZONE 2 | TRIODE | SATURATION |
| ZONE 3 | SATURATION | SATURATION |
| ZONE 4 | SATURATION | TRIODE |
| ZONE 5 | OFF | TRIODE |

CMOS CURRENT AMPLIFIER

The present application claims priority of U.S. provisional patent application No. 60/185,499 filed Feb. 28, 2000.

FIELD OF THE INVENTION

The present invention relates to current amplifiers.

BACKGROUND OF THE INVENTION

Current amplifiers are widely used in signal detection/processing systems. For instance, sensors may provide very weak currents proportional to the physical variables acquired. Such current signals may need to be amplified for further processing in electronic circuits.

Two approaches are commonly used.

The first approach consists in using current mirrors. The amplification is performed using large transistors aspect ratios, Dell'Ova et al. (U.S. Pat. No. 5,867,066) describe a circuit which uses current mirrors in one embodiment of their invention. Unfortunately, such designs suffer from great limitations; their implementation requires large silicon surfaces to accommodate large transistors. Such large silicon surfaces produce consequently large parasitic capacitances, increasing delay and power dissipation. Moreover, such current amplifiers usually can not function correctly at weak-current levels.

A second approach consists in employing cascaded transimpedance and transconductance amplifiers. This approach may provide a higher current gain than the first approach. Unfortunately, in most of the existing current amplifiers of this kind, circuit structures are usually complex, involving amplifiers, multiple current sources and current mirrors. As explained with the first approach, current mirrors may be dysfunctional with weak currents. Furthermore, in many reported current amplifiers, a four-level cascoding structure is often used. In each cascoding structure, the transistors are usually set in a saturation mode. It may be difficult to meet such requirements if the supply voltage is low.

Consequently, there is a need for an efficient current amplifier operating at weak current levels.

SUMMARY OF THE INVENTION

It is another object of the present invention to provide a current amplifier which operates with low current signals, in the pico/nano ampere range.

It is an object of the present invention to provide a current amplifier which dissipates low power, e.g. in the range of 0.5 mW, while having a high current gain as well as a high gain-bandwidth product for signals which may be low current signals, in pico/nano ampere range.

Yet another aspect of the present invention is to provide such current amplifier which may be implemented on a small silicon surface, e.g. in CMOS.

According to one aspect of the invention, there is provided a method for converting a time-variable voltage signal into a time-variable output current signal using at least one transistor, the method comprising the steps of receiving the time-variable voltage signal; transmitting the time-variable voltage signal to the drain of a transistor, the transistor being maintained in a linear voltage-current operating mode; converting the time-variable voltage signal into a time-variable current signal using the transistor; and adding the time-variable current signal to a substantially fixed current signal generated by a substantially fixed current source to provide an output time-variable current signal.

According to another aspect of the invention, there is provided a converter for converting a time-variable voltage signal into a time-variable current signal, the converter comprising a first transistor for receiving the time-variable voltage signal and providing a shifted time-variable voltage signal; a second transistor which is maintained in a linear current-voltage operating zone, the second transistor receiving the shifted time-variable voltage signal and providing an intermediary time-variable current signal, the intermediary time-variable current signal being proportional to the time-variable voltage signal; a substantially fixed current source; an output, the output receiving a substantially fixed current signal from the substantially fixed current source and the intermediary time-variable current signal to provide a time-variable current signal, wherein the linear current-voltage operating zone of the second transistor and the substantially fixed current source ensures an efficient current amplification.

BRIEF DESCRIPTION OF THE DRAWINGS

The invention will be better understood by way of the following detailed description of a preferred embodiment with reference to the appended drawings, in which.

PREFERRED EMBODIMENT

Figure 1A:
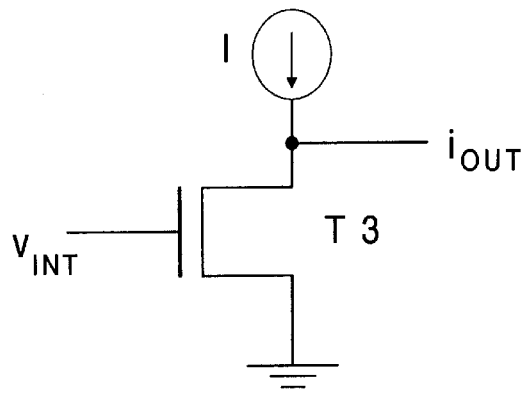
FIG. 1a is an electrical schematic which shows a prior art voltage signal to current signal converter.

Now referring to FIG. 1a, there is shown a prior art voltage to current converter. An input voltage $v_{INT}$ is converted into an output current $i_{OUT}$ using transistor $T_3$.

Unfortunately, such converter does not provide a linear response for any voltage due to its non-linear voltage-to-current transfer characteristic, Such converter may also have difficulties to work with low voltage.

Figure 1B:
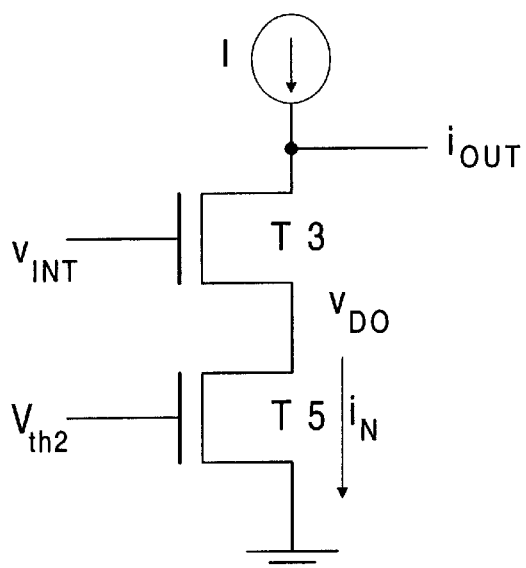
FIG. 1b is an electrical circuit schematic which shows one embodiment of the present invention.

Now referring to FIG. 1b, there is shown one embodiment of the present invention. Transistor $T_3$ transmits a voltage variation $v_{INT}$ into a voltage variation $v_{do}$. Furthermore, transistor $T_5$ is maintained in a linear voltage-current mode. Transistor $T_5$ converts such $v_{do}$ variation into a current variation. Transistor $T_5$ is maintained in a linear voltage-current mode which ensures an efficient voltage to current conversion which overcomes the limitations from the prior art.

Figure 1C:
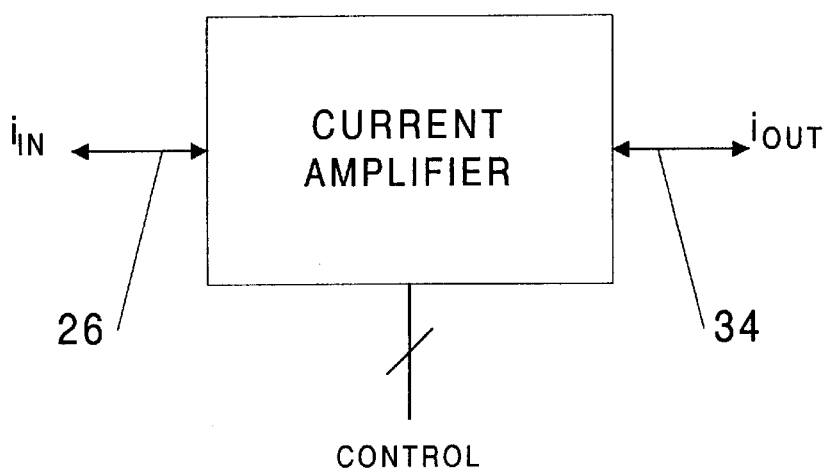
FIG. 1c is a block diagram which shows a bidirectional current amplifier.

As shown in FIG. 1c, a bidirectional current signal amplifier may amplify positive as well as negative current signals. An input 26 receives the current signal to amplify; the output 34 provides the amplified current signal. A control element allows a user as well as a microcontroller or any type of computing means to set the control signals 28, 32, 36.

Figure 2:
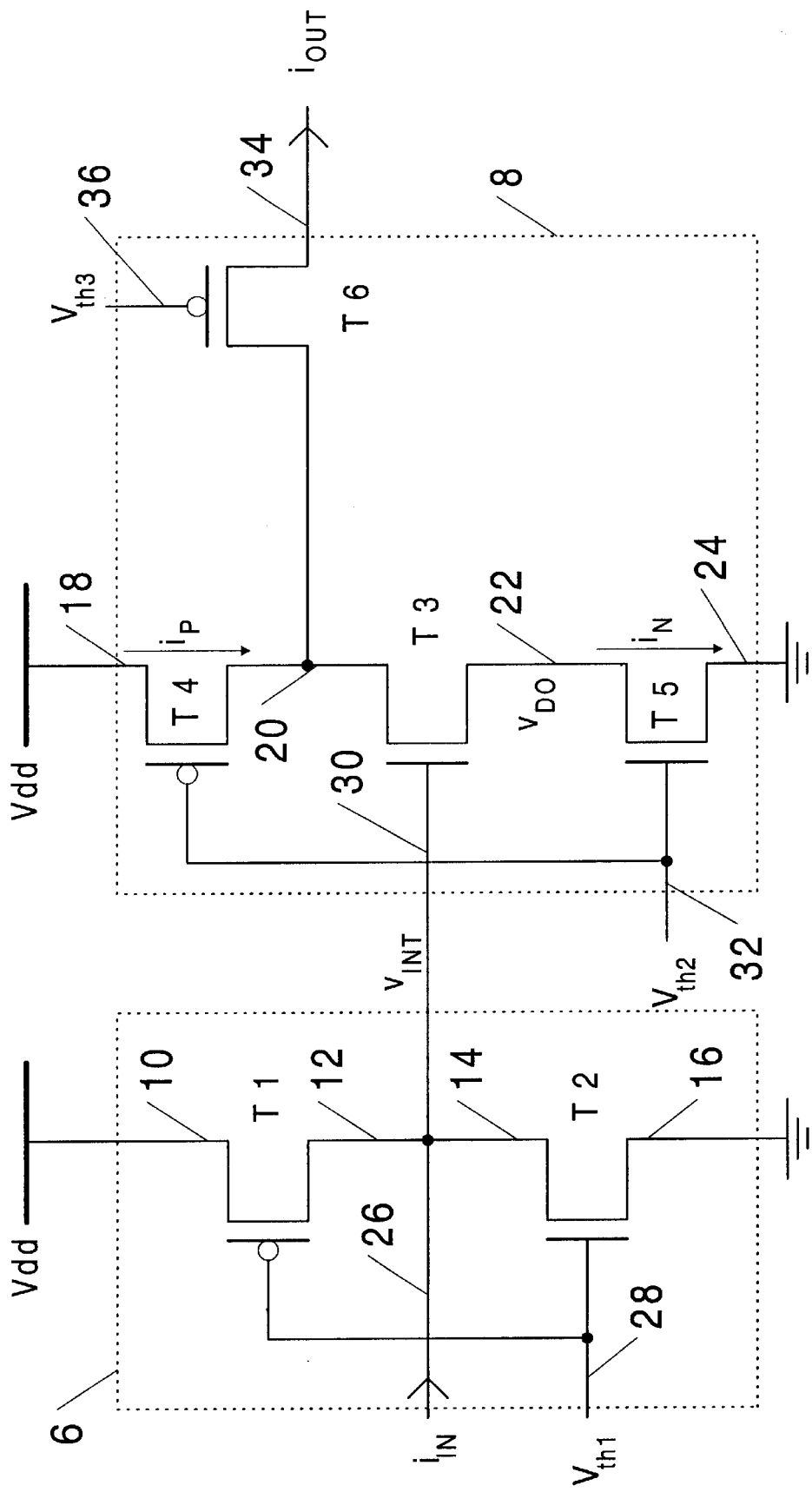
FIG. 2 is an electrical circuit schematic diagram which shows one embodiment of the present invention.

Now referring to FIG. 2, there is shown one embodiment of the present invention. This embodiment of the present invention comprises a transimpedance stage 6 and a transconductance stage 8. The transimpedance stage 6 converts a current into an intermediate voltage $v_{INT}$. The transconductance stage 8 converts the intermediate voltage $v_{INT}$ into an output current $i_{OUT}$.

More precisely, the first stage 6 comprises a NMOS transistor $T_2$ and a PMOS transistor $T_1$. The source of the transistor $T_1$ is connected to a supply voltage source $V_{dd}$. The drain of transistor $T_1$ is connected to the drain of transistor $T_2$. The source of transistor $T_2$ is connected to the ground. The bias of the transistors $T_1$ and $T_2$ are controlled by their common gate voltage $V_{TH1}$ 28. The input current signal $i_{IN}$ is injected into or pulled out of the drain of transistor $T_1$ and transistor $T_2$.

Figures 3A, 3B:
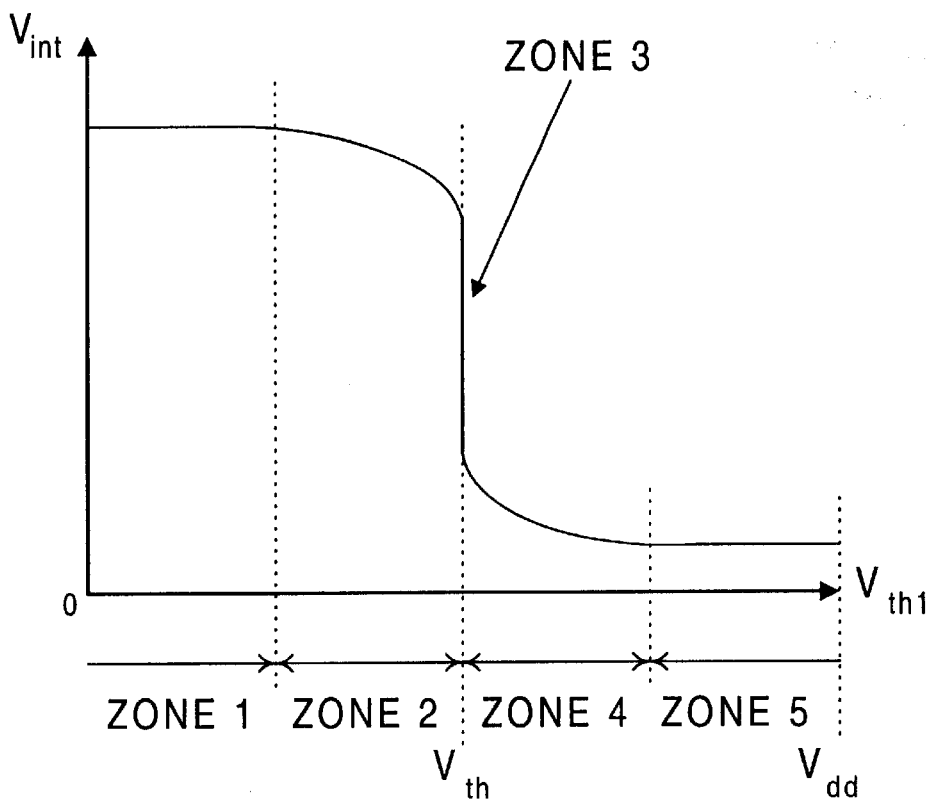
FIG. 3a is a graph which shows the output voltage versus the control gate voltage for the CMOS-inverter-like first stage for various operation modes of the NMOS and PMOS transistors of the stage.
FIG. 3b shows the state of each transistor of the first stage for each zone.
Figure 4:
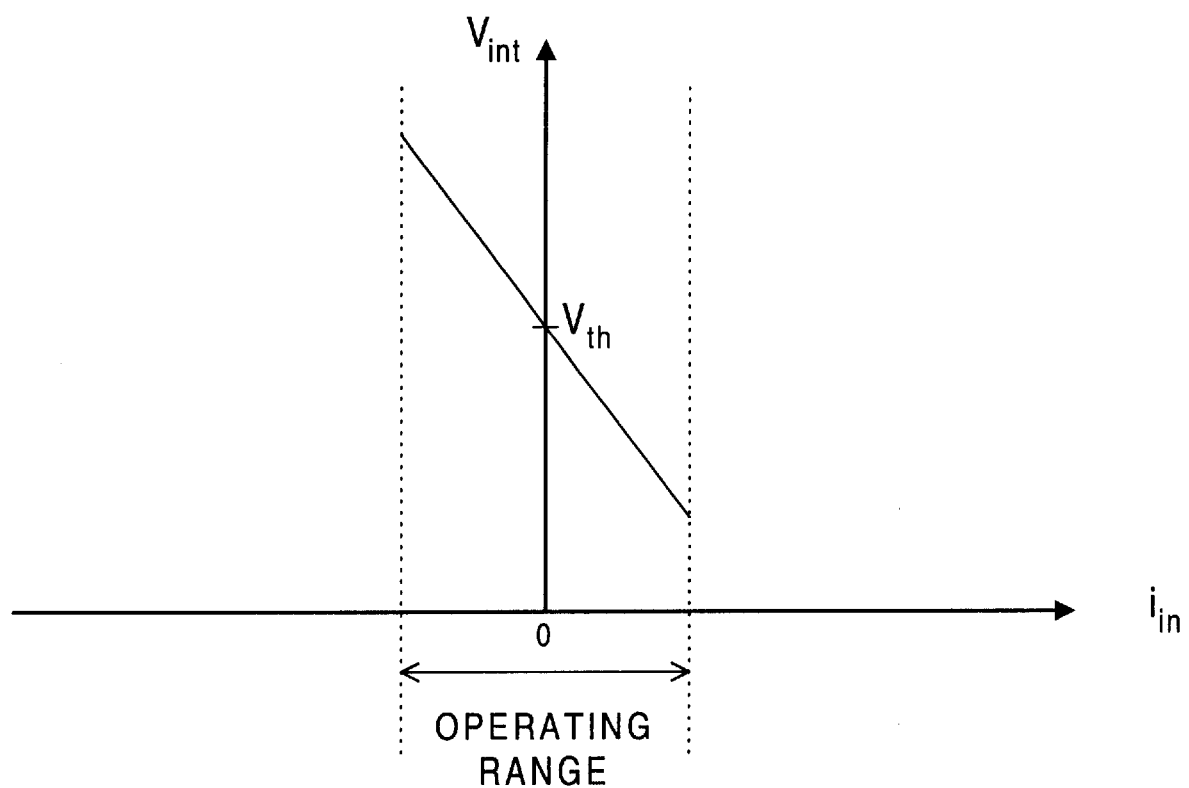
FIG. 4 is a graph which shows the output voltage of the first stage versus the input current over the operating range.

Now referring to FIG. 3a, there is shown the intermediate voltage $V_{INT}$ versus the control gate voltage $V_{TH1}$ of the first stage of one embodiment of the present invention.

If the input current of this first stage is equal to zero, this first stage of the current amplifier is, in fact, a CMOS inverter. Such a CMOS inverter operates in 5 different regions as illustrated in FIG. 3b.

Applying the threshold voltage $V_{TH1}$ of the inverter at the common gate 28 makes the two transistors, $T_1$ and $T_2$, operate simultaneously in the saturation region and their common drain voltage $V_{INT}$ is equal to the threshold voltage as shown in FIG. 3a. This is the biasing condition of the first stage of the current amplifier.

If an input current $i_{IN}$ is injected into the first stage 6, and $i_{IN}$ is small enough, the intermediate voltage $v_{INT}$ of the first stage 6 will be changed to $V_{TH1}-v_d$, wherein $v_d$ is equal to $i_{IN} \cdot r_d$, $r_d$ being the resistance from a drain point of view. In this embodiment of the present invention, $r_d$ is approximately equal to the product $r_{dSN} \cdot r_{dSP}/(r_{dSN}+r_{dSP})$, $r_{dSN}$ and $r_{dSP}$ being the drain-to-source resistances of transistors $T_2$ and $T_1$, respectively. As $r_d$ may be a few hundred of mega-ohms, $v_{INT}$ is highly sensitive to $i_{IN}$.

Now referring back to FIG. 2, and according to one embodiment of the present invention, the second stage 8 comprises two NMOS transistors $T_3$ and $T_5$ and two PMOS transistors $T_4$ and $T_6$. The source 24 of transistor $T_5$ is connected to the ground. The drain 22 of transistor $T_5$ is connected to the source of transistor $T_3$. The drain of transistor $T_3$ is connected to the common drain of transistor $T_4$ and $T_6$. The source of transistor $T_4$ is connected to the voltage supply source $V_{dd}$. Both gates of transistors $T_4$ and $T_5$ are connected together, at which a bias voltage $V_{TH2}$ is applied. The value of $V_{TH2}$ is chosen to drive $T_4$ and $T_5$ in the saturation region in case of 22 and 20 being shorted. The input of the second stage 8 is applied at the gate of transistor $T_3$. Transistor $T_3$ operates as a source follower and transfers the input voltage signal from node $v_{INT}$ to node $v_{DO}$. This results in a low voltage level at the drain of $T_5$ and it is, therefore, driven in the triode region. Transistor $T_5$ converts a variation $v_{do}$ into a variation $i_n$. It will be appreciated that the conversion of $v_{do}$ into a variation of $i_n$ is performed efficiently as the drain-to-source resistance of transistor $T_5$ operating in the triode region is small. Transistor $T_4$ provides an almost constant current is $i_p$, $i_p=I_P$. Transistor $T_6$ operates, in the preferred embodiment of the present invention, in the saturation mode. Transistor $T_6$ ensures a high output impedance of the current amplifier as well as a stabilization of the signal from following stages.

When the input current $i_{IN}$ is zero at the input 26 of the first stage 6, the input 30 of the second stage 8 has a voltage $v_D$ equal to $V_{TH1}$, transistor $T_4$ generates a current $I_P$, the current of transistor $T_5$ is $i_N=I_N=I_P$. The output current is equal to $i_{OUT}=I_{OUT}=I_P-I_N$ according to Kirchhoff's current law. If the input current is non-zero at the input of the first stage 6, and as previously explained, the output of the first stage $v_{IN}$ will be equal to $V_{TH1}-v_d$, the drain of transistor $T_5$ will encounter a variation of $-v_{do}$. The current which flows though the drain of transistor $T_5$ will be equal to $i_N=I_N-i_n$ wherein $i_n=v_{do}/r_{dSN5}$, where $r_{dSN5}$ is the drain-to-source resistance of transistor $T_5$ operating in the triode mode. The output current $i_{OUT}$ is equal to $i_P-i_N$ and by definition is equal to $i_{out}+I_{OUT}$. The output signal current $i_{out}$ is equal to $i_{out}=v_{do}/r_{dSN5}$. $v_{do}$ is equal to $kr_d i_{in}$ wherein $k=v_{do}/v_d$. The gain from the current amplifier is therefore $A_i=k \cdot r_d/r_{dSN5}$, which is far more important than 1. It will be appreciated that this current amplifier is capable of operating with bi-directional current signal.

What is claimed is:

1. A circuit for converting a time-variable voltage signal into a time-variable current signal, said circuit comprising:
   a first transistor for receiving said time-variable voltage signal and providing a shifted time-variable voltage signal;
   a second transistor which is maintained in a linear current-voltage operating zone, said second transistor receiving said shifted time-variable voltage signal and providing an intermediary time-variable current signal, said intermediary time-variable current signal being proportional to said time-variable voltage signal;
   a substantially fixed current source;
   an output, said output receiving a substantially fixed current signal from said substantially fixed current source and said intermediary time-variable current signal to provide a time-variable current signal.

2. The circuit as claimed in claim 1, further comprising a third transistor receiving said time-variable current signal and providing said time-variable current signal with isolation from following stages.

3. The circuit as claimed in claim 1, further comprising a transimpedance amplifier stage, said transimpedance amplifier receiving an input time-variable current signal and providing said time-variable voltage signal.

4. The circuit as claimed in claim 1, wherein said first transistor, said second transistor and said substantially fixed current source are embedded on the same substrate.

5. The circuit as claimed in claim 1, wherein said substantially fixed current source is a transistor.

6. The circuit as claimed in claim 3, wherein said transimpedance amplifier stage comprises two transistors, each of said two transistors are working in the saturation mode with their drain connected together to said input time-variable current signal as well as to said time-variable voltage signal.

7. A method for converting a time-variable voltage signal into an output time-variable current signal, said method comprising the steps of:
   providing a substantially fixed current signal generated by a substantially fixed current source;
   providing a resistance in a path between said current source and a reference;
   shifting said time-variable voltage signal onto said path between said current source and said resistance to generate a time-variable current signal flowing through said resistance; and
   adding said time-variable current signal and said substantially fixed current signal to provide said output time-variable current signal.

8. The method as claimed in claim 7, further comprising the step of providing said output time-variable current signal with an isolation from following stages.

9. A method for amplifying an input time-variable current signal into an output time-variable current signal using at least one transistor, said method comprising the steps of:

receiving said input time-variable current signal;

converting said input time-variable current signal into an interstage time-variable voltage signal;

providing a substantially fixed current signal generated by a substantially fixed current source;

providing a resistance in a path between said current source and a reference;

shifting said time-variable voltage signal onto said path between said current source and said resistance to generate a time-variable current signal flowing through said resistance; and adding said time-variable current signal and said substantially fixed current signal to provide said output time-variable current signal.

10. The method as claimed in claim 9, further comprising the step of providing said output time-variable current signal with an isolation from following stages.

11. The method as claimed in claim 9, wherein said resistance is provided by means of a drain-to-source resistance of a transistor.

12. A method as claimed in claim 7, wherein said shifting is provided by means of said time-variable voltage signal being applied to a gate of a transistor and shifted to a source of said transistor.

13. A method as claimed in claim 9, wherein said shifting is provided by means of said time-variable voltage signal being applied to a gate of a transistor and shifted to a source of said transistor.

* * * * *